(12) United States Patent
Honda et al.

(10) Patent No.: US 11,786,966 B2
(45) Date of Patent: Oct. 17, 2023

(54) SHEET FOR HEAT BONDING, AND SHEET FOR HEAT BONDING HAVING DICING TAPE

(71) Applicant: NITTO DENKO CORPORATION, Ibaraki (JP)

(72) Inventors: Satoshi Honda, Ibaraki (JP); Yuki Sugo, Ibaraki (JP); Mayu Shimoda, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 341 days.

(21) Appl. No.: 16/322,086

(22) PCT Filed: May 18, 2017

(86) PCT No.: PCT/JP2017/018684
§ 371 (c)(1),
(2) Date: Jan. 30, 2019

(87) PCT Pub. No.: WO2018/042772
PCT Pub. Date: Mar. 8, 2018

(65) Prior Publication Data
US 2019/0184460 A1    Jun. 20, 2019

(30) Foreign Application Priority Data

Aug. 31, 2016   (JP) .................. 2016-170117

(51) Int. Cl.
*B32B 27/36*    (2006.01)
*B32B 27/08*    (2006.01)
(Continued)

(52) U.S. Cl.
CPC .................. *B22F 3/02* (2013.01); *B32B 7/12* (2013.01); *B32B 27/08* (2013.01); *B32B 27/36* (2013.01);
(Continued)

(58) Field of Classification Search
CPC . B22F 3/02; C23C 28/04; C23C 28/34; C23C 28/30; C23C 28/00; B32B 27/365;
(Continued)

(56) References Cited

U.S. PATENT DOCUMENTS

2007/0109749 A1* 5/2007 Kwon ................. H01L 23/4334
                                                                    361/719
2010/0270515 A1   10/2010 Yasuda et al.
(Continued)

FOREIGN PATENT DOCUMENTS

| CN | 108136503 A | 6/2018 |
|---|---|---|
| CN | 108207115 A | 6/2018 |

(Continued)

OTHER PUBLICATIONS

Czech et al., Thermal decomposition of acrylic pressure-sensitive adhesives, Polish Journal of Chemical Technology, 11, 4, 7-12, 2009 (Year: 2009).*

(Continued)

*Primary Examiner* — Rebecca Janssen
(74) *Attorney, Agent, or Firm* — Alleman Hall Creasman & Tuttle LLP

(57) ABSTRACT

A sheet for heat bonding, having a pre-sintering layer that becomes a sintered layer by being heated, and an adhesion layer.

4 Claims, 2 Drawing Sheets

(51) Int. Cl.
| | |
|---|---|
| C09J 7/22 | (2018.01) |
| B32B 7/12 | (2006.01) |
| C09J 133/06 | (2006.01) |
| C09J 7/30 | (2018.01) |
| B22F 3/02 | (2006.01) |
| H01L 21/52 | (2006.01) |
| C23C 28/04 | (2006.01) |
| C23C 28/00 | (2006.01) |
| C09J 11/04 | (2006.01) |
| C09J 9/02 | (2006.01) |
| C08F 220/18 | (2006.01) |
| C09J 7/10 | (2018.01) |
| H01L 21/304 | (2006.01) |
| H01L 21/683 | (2006.01) |

(52) U.S. Cl.
CPC ...... *B32B 27/365* (2013.01); *C08F 220/1808* (2020.02); *C09J 7/10* (2018.01); *C09J 7/22* (2018.01); *C09J 7/30* (2018.01); *C09J 9/02* (2013.01); *C09J 11/04* (2013.01); *C09J 133/066* (2013.01); *C23C 28/00* (2013.01); *C23C 28/04* (2013.01); *C23C 28/30* (2013.01); *C23C 28/34* (2013.01); *H01L 21/3043* (2013.01); *H01L 21/52* (2013.01); *H01L 21/6836* (2013.01); *C08K 2201/001* (2013.01); *C09J 2203/326* (2013.01); *C09J 2301/408* (2020.08); *C09J 2301/41* (2020.08); *H01L 2221/68327* (2013.01); *H01L 2221/68381* (2013.01); *H01L 2224/48091* (2013.01); *H01L 2224/73265* (2013.01); *H01L 2924/181* (2013.01)

(58) Field of Classification Search
CPC .......... B32B 27/08; B32B 27/36; B32B 7/12; B32B 2405/00; B32B 2260/046; B32B 2262/101; B32B 2264/105; B32B 2307/732; B32B 27/283; B32B 27/288; B32B 27/34; B32B 27/304; B32B 27/281; B32B 27/285; B32B 27/32; B32B 27/308; B32B 27/40; B32B 23/20; B32B 27/306; B32B 2250/44; B32B 23/12; B32B 27/14; B32B 29/04; B32B 5/30; B32B 15/16; B32B 5/02; B32B 5/16; C09J 7/22; C09J 11/04; C09J 9/02; C09J 133/066; C09J 7/30; C09J 7/10; C09J 2301/41; C09J 2301/408; C09J 2203/326; C08F 220/18; C08F 220/1808; C08F 220/20; H01L 21/3043; H01L 21/6836; H01L 21/52; H01L 2224/48091; H01L 2224/73265; H01L 2924/181; H01L 2221/68327; H01L 2221/68381; H01L 2224/8384; H01L 2224/27002; H01L 2224/27436; H01L 2924/00012; H01L 2924/00014; C08K 2201/001
See application file for complete search history.

(56) References Cited

U.S. PATENT DOCUMENTS

| | | |
|---|---|---|
| 2012/0211764 A1 | 8/2012 | Okamoto et al. |
| 2012/0263947 A1 | 10/2012 | Ozawa et al. |
| 2014/0227613 A1* | 8/2014 | Yoo .............. H01M 4/8857 204/290.01 |
| 2015/0110985 A1 | 4/2015 | Sakaguchi et al. |
| 2017/0144221 A1 | 5/2017 | Ghoshal et al. |
| 2017/0369744 A1 | 12/2017 | Sugo et al. |
| 2018/0033716 A1* | 2/2018 | Viswanathan .......... H01L 24/83 |
| 2018/0257142 A1 | 9/2018 | Kamakura et al. |
| 2018/0265744 A1 | 9/2018 | Sugo et al. |
| 2018/0315729 A1 | 11/2018 | Sugo et al. |
| 2019/0016929 A1 | 1/2019 | Mihara et al. |
| 2019/0043824 A1 | 2/2019 | Sugo et al. |

FOREIGN PATENT DOCUMENTS

| | | | |
|---|---|---|---|
| CN | 108235783 A | 6/2018 | |
| CN | 109070230 A | 12/2018 | |
| EP | 3357607 A1 | 8/2018 | |
| EP | 3358605 A1 | 8/2018 | |
| EP | 3358606 A1 | 8/2018 | |
| EP | 3434398 A1 | 1/2019 | |
| JP | 08229695 A * | 9/1996 | ............... C09J 7/28 |
| JP | 08229695 A | 9/1996 | |
| JP | H08229696 A | 9/1996 | |
| JP | 2000040678 A | 2/2000 | |
| JP | 2012169355 A | 9/2012 | |
| JP | 2012178507 A | 9/2012 | |
| JP | 2012223904 A | 11/2012 | |
| JP | 2014201687 A | 10/2014 | |
| JP | 2015012187 A | 1/2015 | |
| JP | 2015109434 A | 6/2015 | |
| JP | 2016121329 A | 7/2016 | |
| JP | 5972489 B1 | 8/2016 | |
| JP | 5989928 B1 | 9/2016 | |
| KR | 20150120765 A | 10/2015 | |
| WO | 2015034579 A1 | 3/2015 | |
| WO | 2015060346 A1 | 4/2015 | |
| WO | WO-2016104188 A1 * | 6/2016 | ............. C09J 11/04 |

OTHER PUBLICATIONS

International Bureau of WIPO, International Preliminary Report on Patentability Issued in Application No. PCT/JP2017/018684, dated Mar. 14, 2019, WIPO, 5 pages.

European Patent Office, Extended European Search Report Issued in Application No. 17845783.4, dated Apr. 25, 2019, Germany, 7 pages.

ISA Japan Patent Office, International Search Report Issued in Application No. PCT/JP2017/018684, dated Aug. 15, 2017, WIPO, 3 page.

Japan Patent Office, Office Action Issued in Application No. 2016170117, dated May 26, 2020, 7 pages.

European Patent Office, Office Action Issued in Application No. 17845783.4, dated Mar. 31, 2020, Netherlands, 4 pages.

Taiwan Intellectual Property Office, Office Action and Search Report Issued in Application No. 106124579, dated May 6, 2021, 10 pages.

China National Intellectual Property Administration, Office Action and Search Report Issued in Application No. 201780043403.6, dated Sep. 21, 2022, 18 pages.

European Patent Office, Office Action Issued in Application No. 17845783.4, dated Mar. 14, 2023, Netherlands, 4 pages.

China National Intellectual Property Administration, Office Action Issued in Application No. 201780043403.6, dated Feb. 23, 2023, 15 pages.

* cited by examiner

SHEET FOR HEAT BONDING, AND SHEET FOR HEAT BONDING HAVING DICING TAPE

TECHNICAL FIELD

The present invention relates to a sheet for heat bonding and a sheet for heat bonding having dicing tape.

BACKGROUND ART

In the manufacture of a semiconductor device, a method for bonding a semiconductor element to an adherend such as a metal lead frame (a so-called die bonding method) has been developed from a conventional method for using gold-silicon eutectic bonding to a method for using solder or a resin paste. At the present time, an electrically conductive resin paste may be used.

In recent years, a power semiconductor device for controlling and supplying electric power has been remarkably widely used. Since a current always flows in the power semiconductor device, the power semiconductor device has a large heat value. Therefore, an electrically conductive adhesive used for the power semiconductor device desirably has high heat dissipation properties and low electric resistivity.

Low loss and a high-speed operation are required for the power semiconductor device. Conventionally, semiconductors using Si such as IGBT (Insulated Gate Bipolar Transistor) and MOSFET (Metal-Oxide-Semiconductor Field-Effect Transistor) have been used for the power semiconductor device. In recent years, power semiconductor devices using semiconductors such as SiC and GaN are developed, and are expected to expand from now on.

The semiconductors using SiC and GaN have features such as a large band gap and a high breakdown electrical field to achieve low loss, a high-speed operation, and a high-temperature operation. The high-temperature operation provides a merit in an automobile and a small power converter or the like used under a severe heat environment. In the semiconductor device used under a severe heat environment, a high-temperature operation at about 250° C. is assumed. This causes problems in heat characteristics and reliability in solder and an electrically conductive adhesive as conventional bonding and adhesive materials.

Therefore, conventionally, a die bond sheet composed of a porous sheet having a porosity of 15 to 50% by volume, containing silver and/or copper, and having a carbon content of 1.5% by mass or less has been proposed (see, for example, Patent Document 1).

PRIOR ART DOCUMENTS

Patent Document

Patent Document 1: International Publication No. 2015/060346

SUMMARY OF THE INVENTION

Problems to be Solved by the Invention

However, the die bond sheet of Patent Document 1 has a carbon content of 1.5% by mass or less. Therefore, the die bond sheet of Patent Document 1 disadvantageously has low workability while the sheet is prepared. Specifically, in Patent Document 1, a paste-like composition containing a large amount of metal component is prepared, then applied on a glass plate once, and heated to 200° C. to form a cured film. Furthermore, this is peeled off to obtain a die bond sheet. The die bond sheet of Patent Document 1 has low adhesion at the stage before sintering because of its low carbon content. Therefore, disadvantageously, the die bond sheet is less likely to be temporarily fixed to an object to be bonded at the stage before sintering.

Meanwhile, when an attempt is made to add a large amount of organic component to a sheet for heat bonding to improve workability while the sheet is prepared and adhesion during temporary bonding before sintering, the layer after sintering is disadvantageously brittle.

The present invention has been made in view of the above problems, and it is an object of the present invention to provide a sheet for heat bonding which has high adhesion before sintering with respect to an object to be bonded and can strengthen bonding after sintering, and a sheet for heat bonding having dicing tape.

Means for Solving the Problems

In order to solve the above-mentioned conventional problems, the inventors of the present application have studied a sheet for heat bonding. As a result, the inventors have found that, by adopting the following constitution, high adhesion before sintering with respect to an object to be bonded can be achieved, and bonding after sintering can be strengthened, and have completed the present invention.

That is, a sheet for heat bonding according to the present invention includes a pre-sintering layer serving as a sintered layer after being heated and an adhesive layer.

According to the above-described constitution, the sheet for heat bonding includes the pre-sintering layer and the adhesive layer. Therefore, when the object to be bonded (for example, a wafer) is laminated to the adhesive layer, the object to be bonded can be firmly fixed to the sheet for heat bonding before sintering. The sheet for heat bonding includes the adhesive layer, whereby the adhesion before sintering of the pre-sintering layer with respect to the object to be bonded may not be considered. As a result, as the pre-sintering layer, a composition serving as a strengthened sintered layer after sintering can be adopted. As described above, according to the sheet for heat bonding according to the present invention, high adhesion before sintering with respect to the object to be bonded can be achieved, and the bonding after sintering can be strengthened.

In the above constitution, it is preferable that the pre-sintering layer contains metal fine particles and an organic binder; and the adhesive layer contains at least an organic binder.

When the pre-sintering layer contains the metal fine particles, the sintered layer can be formed by heating. When the pre-sintering layer and the adhesive layer contain the organic binder, the layers are easily treated as a sheet. When the adhesive layer contains the organic binder, the adhesion at the stage before sintering is easily controlled.

In the above constitution, it is preferable that the content of the metal fine particles contained in the pre-sintering layer is in a range of 30 to 70% by volume based on the entire pre-sintering layer, and the content of the metal fine particles contained in the adhesive layer is in a range of 0 to 30% by volume based on the entire adhesive layer.

When the content of the metal fine particles contained in the pre-sintering layer is within the range of 30 to 70% by volume based on the entire pre-sintering layer, the sintered layer can be suitably formed by heating.

When the content of the metal fine particles contained in the adhesive layer is within the range of 0 to 30% by volume based on the entire adhesive layer, the content of the metal fine particles is less, whereby the adhesion at the stage before sintering is easily controlled.

In the above constitution, it is preferable that the organic binder contained in the pre-sintering layer contains a thermally decomposable binder; and the organic binder contained in the adhesive layer contains a thermally decomposable binder.

When the organic binder contained in the pre-sintering layer contains the thermally decomposable binder, and the pre-sintering layer serves as the sintered layer after being heated, the thermally decomposable binder is thermally decomposed. As a result, the sintered layer can be more suitably formed. When the organic binder contained in the adhesive layer contains the thermally decomposable binder, the thermally decomposable binder in the adhesive layer is thermally decomposed by heating for sintering. As a result, a large influence on bonding provided by sintering can be prevented.

In the above constitution, it is preferable that the thickness of the pre-sintering layer is in the range of 5 to 100 μm, and the thickness of the adhesive layer is in the range of 2 to 20 μm.

When the thickness of the pre-sintering layer is in the range of 5 to 100 μm, the sintered layer can be more suitably formed.

The adhesive layer contains no metal fine particles, or contains the metal fine particles in an amount less than that in the pre-sintering layer. Therefore, a too thick adhesive layer hinders bonding provided by sintering. Therefore, when the thickness of the adhesive layer is within the range of 2 to 20 μm, a large influence on bonding provided by sintering can be prevented.

A sheet for heat bonding having dicing tape according to the present invention includes: a dicing tape; and the sheet for heat bonding, wherein the sheet for heat bonding is laminated on the dicing tape in a state where the dicing tape and the pre-sintering layer are in contact with each other.

The sheet for heat bonding having dicing tape allows a step of laminating the sheet for heat bonding to the dicing tape to be omitted since the sheet for heat bonding is integrated with the dicing tape. The adhesive layer is present, whereby, by laminating the object to be bonded to the adhesive layer, the object to be bonded can be firmly fixed to the sheet for heat bonding before sintering. The sheet for heat bonding includes the adhesive layer, whereby the adhesion before sintering of the pre-sintering layer with respect to the object to be bonded may not be considered. As a result, as the pre-sintering layer, a composition serving as a strengthened sintered layer after sintering can be adopted. As described above, according to the sheet for heat bonding having dicing tape according to the present invention, high adhesion before sintering with respect to the object to be bonded can be achieved, and the bonding after sintering can be strengthened.

MODE FOR CARRYING OUT THE INVENTION (Sheet for Heat Bonding Having Dicing Tape)

Figure 1:
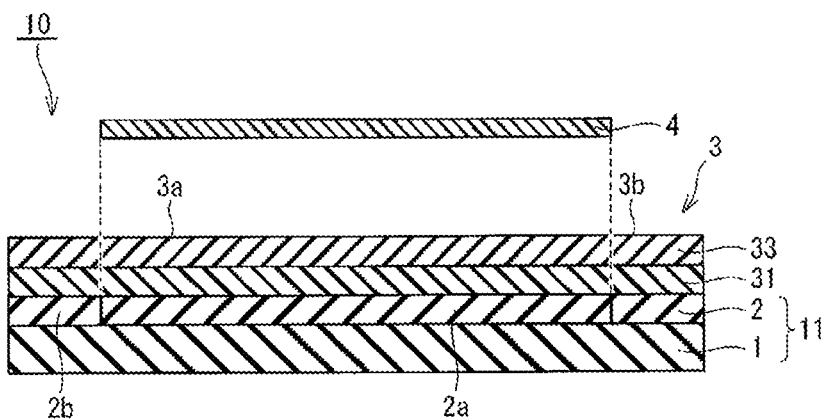
FIG. 1 is a schematic cross-sectional view showing a sheet for heat bonding having dicing tape according to an embodiment of the present invention.
Figure 2:
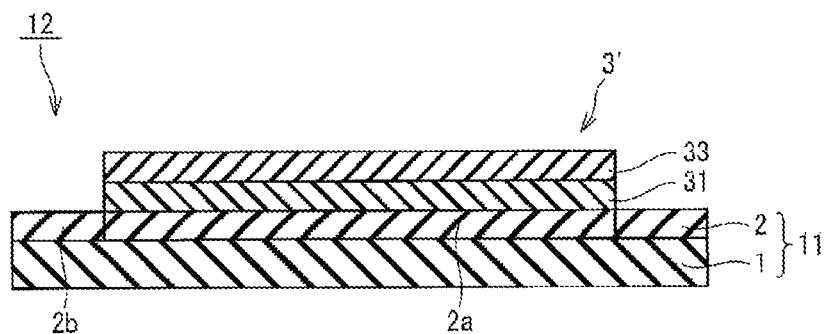
FIG. 2 is a schematic cross-sectional view showing a sheet for heat bonding having dicing tape according to another embodiment of the present invention.

A sheet for thermal bonding according to one embodiment of the present invention and a sheet for heat bonding having dicing tape will be described below. Examples of the sheet for heat bonding according to the present embodiment include a sheet for heat bonding in which a dicing tape is not pasted to the sheet for heat bonding in a sheet for heat bonding having dicing tape to be described below. Therefore, hereinafter, the sheet for heat bonding having dicing tape will be described, where the sheet for heat bonding will be described. FIG. 1 is a schematic sectional view showing a sheet for heat bonding having dicing tape according to one embodiment of the present invention. FIG. 2 is a schematic sectional view showing a sheet for heat bonding having dicing tape according to another embodiment of the present invention.

As shown in FIG. 1, a sheet for heat bonding having dicing tape 10 has a configuration in which a sheet for heat bonding 3 is laminated on a dicing tape 11. The dicing tape 11 is configured by laminating a pressure-sensitive adhesive layer 2 on a substrate 1, and the sheet for heat bonding 3 is provided on the pressure-sensitive adhesive layer 2.

A sheet for heat bonding having dicing tape of the present invention may also have a configuration in which a sheet for heat bonding 3' is formed only on a work piece pasting portion as in a sheet for heat bonding having dicing tape 12 shown in FIG. 2.

(Sheet for Heat Bonding)

Sheets for heat bonding 3, 3' are sheet-shaped. The sheet for heat bonding is not a paste but a sheet, which can suppress a compositional material of the sheet for heat bonding from protruding during bonding and from creeping up onto the surface of an object to be bonded.

Each of the sheets for heat bonding 3, 3' according to the present embodiment includes a pre-sintering layer 31 serving as a sintered layer after being heated and an adhesive layer 33. The sheet for heat bonding 3 is laminated on a dicing tape 11 in a state where the dicing tape 11 and the pre-sintering layer 31 are in contact with each other.

In the present embodiment, a case will be described, in which the sheet for heat bonding 3 is constituted by two layers of the pre-sintering layer 31 and the adhesive layer 33, but the sheet for heat bonding 3 may include another layer as long as it does not contradict the gist of the present invention. The pre-sintering layer in the present invention may have a configuration in which a plurality of layers serving as a sintered layer after being heated are stacked. That is, the sheet for heat bonding in the present invention may include the pre-sintering layer and the adhesive layer, and the configuration of the sheet for heat bonding is not particularly limited.

Each of the sheet for heat bonding 3, 3' includes the adhesive layer 33, whereby, if the object to be bonded (for example, a wafer) is laminated to the adhesive layer 33, the object to be bonded can be firmly fixed to the sheets for heat bonding 3, 3' before sintering. Each of the sheet for heat bonding 3, 3' includes the adhesive layer 33, whereby the adhesion before sintering of the pre-sintering layer 31 with respect to the object to be bonded may not be considered. As a result, the pre-sintering layer 31 can adopt a composition serving as a strengthened sintered layer after sintering. As described above, according to the sheet for heat bonding 3, 3', high adhesion before sintering with respect to the object to be bonded can be achieved, and the bonding after sintering can be strengthened.

(Pre-Sintering Layer)

The pre-sintering layer 31 is a layer serving as a sintered layer after being heated.

The pre-sintering layer 31 preferably contains metal fine particles and an organic binder. When the pre-sintering layer 31 contains the metal fine particles, a sintered layer can be formed by heating. If the pre-sintering layer 31 contains the organic binder, the pre-sintering layer 31 is easily treated as a sheet.

The content of the metal fine particles contained in the pre-sintering layer 31 is preferably in the range of 30 to 70% by volume based on the entire pre-sintering layer 31. The content of the metal fine particles is more preferably in the range of 35 to 65% by weight, and still more preferably in the range of 40 to 60% by weight. When the metal fine particles are contained in the range of 30 to 70% by volume, the sintered layer can be suitably formed by heating. As a result, the metal fine particles can be sintered or melted to bond two objects (for example, a semiconductor chip and a lead frame).

The content of the metal fine particles contained in the pre-sintering layer 31 is measured by the following method. The content of the metal fine particles contained in the adhesive layer 33 described later is also measured by the same method.

1. The pre-sintering layer is ion-polished in a cooling environment to expose a cross section of the pre-sintering layer.

2. An image of the cross section is taken by using a field emission type scanning electron microscope SU 8020 (manufactured by Hitachi High-Technologies Corporation). Imaging conditions of an acceleration voltage of 5 kV and a magnification ratio of 50000 times are set, and a reflected electron image is obtained as image data.

3. Using image analysis software Image J, the obtained image data is subjected to an automatic binarization treatment, and the content of the metal fine particles is then calculated from the area of a bright part derived from the metal fine particles based on the whole. At this time, in general, in a direction perpendicular to the observed cross section, the area of the bright part derived from the metal fine particles is uniform, whereby % by volume is defined to be the same as % by area obtained here.

Examples of the fine metal particles include sintering metal particles.

As the sintering metal particles, an aggregate of fine metal particles can be suitably used. Examples of the fine metal particles include fine particles made of a metal. Examples of the metal include gold, silver, copper, silver oxide, and copper oxide. Among these, the metal is preferably at least one selected from the group consisting of silver, copper, silver oxide, and copper oxide. The fine metal particles are made of at least one selected from the group consisting of silver, copper, silver oxide, and copper oxide, which can provide more suitable thermal bonding.

The average particle diameter of the sintering metal particles is preferably 0.0005 μm or more, and more preferably 0.001 μm or more. Examples of the lower limit of the average particle diameter include 0.01 μm, 0.05 μm, and 0.1 μm. On the other hand, the average particle diameter of the sintering metal particles is preferably 30 μm or less, and more preferably 25 μm or less. Examples of the upper limit of the average particle diameter include 20 μm, 15 μm, 10 μm, and 5 μm.

The average particle diameter of the sintering metal particles is measured by the following method. That is, the sintering metal particles are observed by a SEM (scanning electron microscope), to measure an average particle size. During SEM observation, for example, micro-sized sintering metal particles are preferably observed at a magnification of 5,000; submicron-sized sintering metal particles are preferably observed at a magnification of 50,000; and nano-sized sintering metal particles are preferably observed at a magnification of 300,000.

Examples of the shape of the sintering metal particles include a spherical shape, a rod shape, a scale shape, and an infinite shape without particular limitation.

The organic binder contained in the pre-sintering layer 31 preferably contains a thermally decomposable binder.

When the thermally decomposable binder is contained, and the sintered layer is formed by heating, the thermally decomposable binder is thermally decomposed. As a result, the sintered layer can be more suitably formed.

The thermally decomposable binder is preferably solid at 23° C. Herein, the term "solid" specifically means that viscosity at 23° C. obtained by viscosity measurement with the rheometer is more than 100,000 Pa·s. When the thermally decomposable binder is solid at 23° C., a sheet for heat bonding at room temperature (23° C.) is likely to be formed into a film shape, thereby improving the handling property.

The thermally decomposable binder usually has a molecular weight of more than 500.

Herein, the term "thermally decomposable binder" refers to a binder which can be thermally decomposed in the thermal bonding step. It is preferable that the thermally decomposable binder hardly remain in the sintered layer (the pre-sintering layer 31 after being heated) after the thermal bonding step. Examples of the thermally decomposable binder include a material having a carbon concentration of 15% by weight or less obtained by energy dispersive X-ray spectrometry after being heated from 23° C. to 400° C. in the air atmosphere at a heating rate of 10° C./min even if the pre-sintering layer 31 contains the material. For example, by adopting a material which is more likely to be thermally decomposed as the thermally decomposable binder, the material is allowed to hardly remain in the sintered layer (the pre-sintering layer 31 after being heated) after the thermal bonding step even if the content of the material is comparatively increased.

Examples of the thermally decomposable binder include polycarbonate, an acrylic resin, ethylcellulose, and polyvinyl alcohol. These materials can be used singly or in combination of two or more. Among these, from the viewpoint of high thermal decomposability, polycarbonate is preferable.

The polycarbonate is not particularly limited as long as the polycarbonate can be thermally decomposed in the thermal bonding step. Examples of the polycarbonate include aliphatic polycarbonate containing an aliphatic chain without containing an aromatic compound (for example, a benzene ring or the like) between ester carbonate groups (—O—CO—O—) as a main chain, and aromatic polycarbonate containing an aromatic compound between ester carbonate groups (—O—CO—O—) as a main chain. Among these, aliphatic polycarbonate is preferred.

Examples of the aliphatic polycarbonate include polyethylene carbonate and polypropylene carbonate. Among these, polypropylene carbonate is preferred from the viewpoint of solubility in an organic solvent when a varnish for forming a sheet is produced.

Examples of the aromatic polycarbonate include those having a bisphenol A structure as a main chain.

The weight average molecular weight of the polycarbonate is suitably in a range of 10,000 to 1,000,000. The weight average molecular weight is a value that is measured by GPC (gel permeation chromatography) and calculated in terms of polystyrene.

Examples of the acrylic resin include a polymer (acrylic copolymer) containing, as a component or components, one or more esters of acrylic acid or methacrylic acid having a linear or branched alkyl group having 30 or less carbon atoms, in particular, 4 to 18 carbon atoms in a range in which the acrylic resin can be thermally decomposed in the thermal bonding step. Examples of the alkyl group include a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and a dodecyl group.

Other monomers that form the polymer (acrylic copolymer) are not especially limited, and examples thereof include carboxyl group-containing monomers such as acrylic acid, methacrylic acid, carboxyethyl acrylate, carboxypentyl acrylate, itaconic acid, maleic acid, fumaric acid, and crotonic acid, acid anhydride monomers such as maleic anhydride and itaconic anhydride, hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl)-methylacrylate, sulfonic acid group-containing monomers such as styrene sulfonate, allyl sulfonate, 2-(meth) acrylamide-2-methylpropane sulfonic acid, (meth)acrylamidepropane sulfonic acid, sulfopropyl(meth)acrylate, and (meth)acryloyloxynaphthalene sulfonic acid, and phosphate group-containing monomers such as 2-hydroyethylacryloyl phosphate.

Among the acrylic resins, those more preferably have a weight average molecular weight of 10,000 to 1,000,000, and still more preferably 30,000 to 700,000. When the weight average molecular weight is in the above range, adhesion before the thermal bonding step and thermal decomposition property during the thermal bonding step become excellent. The weight average molecular weight is a value that is measured by GPC (gel permeation chromatography) and calculated in terms of polystyrene.

Among the acrylic resins, an acrylic resin thermally decomposed at 200° C. to 400° C. is preferred.

The organic binder contained in the pre-sintering layer 31 preferably contains 20 to 80% by weight of an organic component having a molecular weight of 500 or less based on the entire organic binder in the pre-sintering layer. The content of the organic component having a molecular weight of 500 or less is more preferably 30 to 70% by weight, and still more preferably 40 to 60% by weight.

The organic component having a molecular weight of 500 or less allows the metal fine particles to be likely to be dispersed in the thermally decomposable binder. Therefore, when the organic binder contained in the pre-sintering layer 31 contains 20 to 80% by weight of an organic component having a molecular weight of 500 or less, the metal fine particles can be easily treated. If the organic component having a molecular weight of 500 or less is used, optional mechanical properties are easily adjusted.

The content of the organic component having a molecular weight of 500 or less and contained in the pre-sintering layer 31 is measured by the following method. The content of the organic component having a molecular weight of 500 or less and contained in the component migration prevention layer 32 and adhesive layer 33 described later is also measured by the same method.

The pre-sintering layer of the sheet for heat bonding is collected, immersed in chloroform, and left stand for 12 hours. This solution is filtered through a 0.45 μm membrane filter, and the filtrate is subjected to GPC fractionation. Fractionation is carried out by using HLC-8320 GPC manufactured by TOSOH Co., Ltd. under the following conditions to separate and collect a component having a molecular weight of 500 or less and a component having a molecular weight of more than 500, and the dry weights of the components are then determined to determine a weight ratio.

Column: Shodex H2003/H2002/H2001
Eluent: chloroform
Flow rate: 4 mL/min
Detector: RI
Column temperature: room temperature (23° C.)
Injection volume: 3000 μL The molecular weight is calculated in terms of polystyrene.

The organic component having a molecular weight of 500 or less preferably contains a low boiling point binder. Herein, the organic component having a molecular weight of 500 or less has a concept including a low boiling point binder and an organic component having a molecular weight of 500 or less other than the low boiling point binder. The organic component having a molecular weight of 500 or less other than the low boiling point binder may, or may not be contained in the pre-sintering layer 31.

The low-boiling binder is used to facilitate the handling of the fine metal particles. The low-boiling binder is also used to adjust optional mechanical properties. Specifically, the low-boiling binder can be used as a fine metal particles-containing paste in which the fine metal particles are dispersed in the low-boiling binder.

The low-boiling binder is generally liquid at 23° C. Herein, the term "liquid" includes semiliquid. Specifically, it means that viscosity at 23° C. obtained by viscosity measurement with a dynamic viscoelasticity measuring device (rheometer) is 100,000 Pa·s or less.

Conditions for viscosity measurement are as follows.
Rheometer: MER III manufactured by Thermo SCIENTFIC Inc.
jig: Parallel plate: 20 mmϕ, gap: 100 μm, shear rate: 1/sec)

The low boiling point binder has a boiling point of 100° C. or more and 400° C. or less. Specific examples of the low-boiling binder include monohydric and polyhydric alcohols such as pentanol, hexanol, heptanol, octanol, 1-decanol, ethylene glycol, diethylene glycol, propylene glycol, butylene glycol, α-terpineol, 1,6-hexanediol, and isobornyl cyclohexanol (MTPH); ethers such as ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether; and ethylene glycol ethyl ether acetate, ethylene glycol butyl ether acetate, diethylene glycol ethyl ether acetate, diethylene glycol butyl ether acetate, and dipropylene glycol methyl ether acetate (DPMA). These may be used in combination of two or more thereof. Among these, two kinds of low-boiling binders having different boiling points are preferably used in combination. When two kinds of low-boiling binders having different boiling points are used, an excellent sheet shape is maintained.

The pre-sintering layer 31 may appropriately contain, for example, a plasticizer and the like, in addition to the above components.

The pre-sintering layer 31 has a carbon concentration of preferably 15% by weight or less, more preferably 12% by weight or less, and still more preferably 10% by weight or less. The carbon concentration is obtained by energy dispersive X-ray spectrometry after being heated from 23° C. to 400° C. in the air atmosphere at a heating rate of 10° C./min. When the carbon concentration is 15% by weight or less, an organic matter is hardly present in the pre-sintering layer 31 after being heated to 400° C. This provides excellent heat resistance after a thermal bonding step, and high reliability and heat characteristics even in a high-temperature environment.

In the pre-sintering layer 31, a peak when differential thermal analysis is performed while being heated from 23° C. to 500° C. in the air atmosphere at a heating rate of 10° C./min is preferably present at 150 to 350° C., more preferably 170 to 320° C., and still more preferably 180 to 310° C. When the peak is present at 150 to 350° C., an organic matter (for example, a resin component constituting the pre-sintering layer 31) can be said to be thermally decomposed in this temperature range. This provides more excellent heat resistance after the thermal bonding step.

The thickness of the pre-sintering layer 31 is preferably in the range of 5 to 100 μm, more preferably in the range of 20 to 90 μm, and still more preferably in the range of 40 to 80 μm. When the thickness of the pre-sintering layer 31 is in the range of 5 to 100 μm, the sintered layer can be more suitably formed.

The thickness of the pre-sintering layer 31 is measured by the following method. The thickness of the adhesive layer 33 described later is also measured by the same method.

1. The pre-sintering layer is ion-polished in a cooling environment to expose a cross section of the pre-sintering layer.
2. An image of the cross section is taken by using a field emission type scanning electron microscope SU 8020 (manufactured by Hitachi High-Technologies Corporation). Imaging conditions of an acceleration voltage of 5 kV and a magnification ratio of 2000 times are set, and a reflected electron image is obtained as image data.
3. Using image analysis software Image J, the thickness is measured from the obtained image data.

(Adhesive Layer)

The adhesive layer 33 is a layer for bringing an object to be bonded (for example, a wafer) into close contact with the sheets for heat bonding 3, 3' before sintering.

The adhesive layer 33 contains a large amount of components decomposed by heating, whereby the adhesive layer 33 is almost decomposed and lost when the pre-sintering layer 31 is heated to form the sintered layer.

The adhesive layer 33 preferably contains at least an organic binder. When the adhesive layer 33 contains the organic binder, the adhesive layer 33 is easily treated as a sheet. When the adhesive layer 33 contains the organic binder, the adhesion at the stage before sintering is easily controlled.

The organic binder contained in the adhesive layer 33 preferably contains a thermally decomposable binder. When the organic binder contained in the adhesive layer 33 contains the thermally decomposable binder, the thermally decomposable binder in the adhesive layer 33 is thermally decomposed by heating for sintering. As a result, a large influence on bonding provided by sintering can be prevented.

As the thermally decomposable binder, the same binder as that used in the pre-sintering layer 31 can be adopted.

The content of the thermally decomposable binder is preferably 20 to 100% by weight, and more preferably 30 to 80% by weight, based on the entire adhesive layer 33. When the content of the thermally decomposable binder is 20 to 100% by weight based on the entire adhesive layer 33, the adhesion at the stage before sintering is more easily controlled.

The organic binder contained in the adhesive layer 33 may contain a low boiling point binder. When the low boiling point binder is contained, the adhesion before sintering is more easily controlled. The low boiling point binder is preferably contained in an amount of 0 to 60% by weight based on the entire organic binder in the adhesive layer. That is, it is preferable that the organic binder contains no low boiling point binder, or contains 60% by weight or less of the low boiling point binder. The content of the low boiling point binder is more preferably 10 to 50% by weight, and still more preferably 20 to 40% by weight.

As the low boiling point binder, the same binder as that used in the pre-sintering layer 31 can be adopted.

It is preferable that the adhesive layer 33 contains no metal fine particles, or contains 30% by volume or less of the metal fine particles based on the entire adhesive layer. That is, the content of the metal fine particles contained in the adhesive layer 33 is preferably in the range of 0 to 30% by volume based on the entire adhesive layer. When the content of the metal fine particles contained in the adhesive layer 33 is within the range of 0 to 30% by volume based on the entire adhesive layer, the content of the metal fine particles is less, whereby the adhesion at the stage before sintering is more easily controlled.

It is preferable that, when the low boiling point binder is contained in the adhesive layer 33, the metal fine particles are contained within the above numerical range. The compatibility between the thermally decomposable binder and the low boiling point binder is poor. Therefore, by mixing the metal fine particles, the compatibility between the thermally decomposable binder and the low boiling point binder can be improved.

As the metal fine particles, the same metal fine particles as those used in the pre-sintering layer 31 can be adopted.

The thickness of the adhesive layer 33 is preferably in the range of 2 to 20 μm, more preferably in the range of 3 to 15 μm, and still more preferably in the range of 5 to 10 μm. The adhesive layer 32 contains no metal fine particles, or contains the metal fine particles in an amount less than that in the pre-sintering layer. Therefore, a too thick adhesive layer hinders bonding provided by sintering. Therefore, when the thickness of the adhesive layer 33 is in the range of 2 to 20 µm, a large influence on bonding provided by sintering can be prevented.

In particular, it is preferable that, when the thickness of the adhesive layer 33 is decreased within the above numerical range, the adhesive layer 33 contains no metal fine particles, or contain the metal fine particles in a less amount within the above numerical range. This is because the adhesion before sintering is easily controlled.

Meanwhile, when the thickness of the adhesive layer 33 is increased within the above numerical range, the content of the metal fine particles is preferably increased within the above numerical range. When the thickness of the adhesive layer 33 is increased, the bonding force of a portion where the adhesive layer 33 is present after sintering may be decreased. Therefore, the metal fine particles are contained to some extent, which make it possible to provide the bonding force after sintering. If the thickness of the adhesive layer 33 is increased, the adhesive force before sintering is easily controlled.

The sheets for heat bonding 3, 3' can be manufactured by the usual method. For example, a varnish containing the components for forming the pre-sintering layer 31 is prepared. The varnish is applied onto a substrate separator to form a coating film so as to have a predetermined thickness, and the coating film is then dried, thereby obtaining the pre-sintering layer 31.

Meanwhile, a varnish containing the components for forming the adhesive layer 33 is prepared. The varnish is applied onto a substrate separator to form a coating film so as to have a predetermined thickness, and the coating film is then dried, thereby obtaining the adhesive layer 33.

Thereafter, by laminating the pre-sintering layer 31 and the adhesive layer 33 to each other, the sheets for heat bonding 3, 3' can be manufactured.

A solvent that is used in the varnish is not particularly limited. However, an organic solvent or an alcoholic solvent is preferred which allows each of the above-described components to be dissolved, kneaded, or dispersed, uniformly. Examples of the organic solvent include ketone-based solvents such as dimethylformamide, dimethylacetamide, N-methylpyrrolidone, acetone, methylethylketone, and cyclohexanone; toluene; and xylene. Examples of the alcoholic solvent include ethylene glycol, diethylene glycol, 1,2-propanediol, 1,3-propanediol, 1,2-butanediol, 1,3-butanediol, 1,4-butanediol, 2-butene-1,4-diol, 1,2,6-hexanetriol, glycerin, octanediol, 2-methyl-2,4-pentanediol, and terpineol.

The applying method is not particularly limited. Examples of methods for coating a solvent include a die coater, a gravure coater, a roll coater, a reverse coater, a comma coater, a pipe doctor coater, and screen printing. Among these, a die coater is preferred in terms of high uniformity in an application thickness. The drying condition of the coating film is not particularly limited. For example, drying can be performed at a drying temperature of 70° C. to 160° C. for a drying time of 1 minute to 5 minutes. Even after the coating film is dried, some solvents may remain in the coating film without the solvents being wholly evaporated.

When the pre-sintering layer 31 contains the low-boiling binder, a part of the low-boiling binder may be volatilized depending on the drying condition. Therefore, the ratios of the respective components constituting the pre-sintering layer 31 vary according to the drying condition. For example, even in the pre-sintering layer 31 formed of the same varnish, the content of the fine metal particles in the entire pre-sintering layer 31 and the content of the thermally decomposable binder are increased as a drying temperature is higher and a drying time is longer. Therefore, the drying condition is preferably set so that the fine metal particles and the thermally decomposable binder are contained in desired amounts in the pre-sintering layer 31. This also applies when the adhesive layer 33 contains the low boiling point binder.

Polyethylene terephthalate (PET), polyethylene, polypropylene, and a plastic film or a paper or the like whose surface is coated with a peeling agent such as a fluorine based peeling agent and a long chain alkylacrylate based peeling agent can be used as the substrate separator.

Another examples of a method for manufacturing the sheets for heat bonding 3, 3' include a method including mixing the components in a mixer to obtain a mixture, press-forming the mixture to prepare the pre-sintering layer 31 and the adhesive layer 33, and laminating these layers. Examples of the mixer include a planetary mixer.

The total thickness of the sheets for heat bonding 3, 3' is preferably 20 to 100 µm, and more preferably 30 to 90 µm, at 23° C. before heating.

(Dicing Tape)

A dicing tape 11 has a configuration in which a pressure-sensitive adhesive layer 2 is laminated on a substrate 1.

The substrate 1 preferably has ultraviolet transmissivity and is a base body for strength of the sheets for heat bonding having a dicing tape 10 and 12. Examples thereof include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene(meth)acrylic acid copolymer; an ethylene(meth) acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper); glass; glass cloth; a fluorine resin; polyvinyl chloride; polyvinylidene chloride; a cellulose resin; a silicone resin; metal (foil); and paper.

Further, the material of the substrate 1 includes a polymer such as a cross-linked body of the above resins. The above plastic film may be also used unstreched, or may be also used on which a monoaxial or a biaxial stretching treatment is performed depending on necessity. According to resin sheets in which heat shrinkable properties are given by the stretching treatment, etc., the adhesive area of the pressure-sensitive adhesive layer 2 and the sheet for heat bonding 3, 3' is reduced by thermally shrinking the substrate 1 after dicing, and the recovery of the semiconductor chips can be facilitated.

A known surface treatment such as a chemical or physical treatment such as a chromate treatment, ozone exposure, flame exposure, high voltage electric exposure, and an ionized ultraviolet treatment, and a coating treatment by an undercoating agent (for example, a tacky substance described later) can be performed on the surface of the substrate 1 in order to improve adhesiveness, holding properties, etc. with the adjacent layer.

The thickness of the substrate 1 can be appropriately decided without limitation particularly.

The pressure-sensitive adhesive that is used to form the pressure-sensitive adhesive layer 2 is not especially limited. Examples include a general pressure-sensitive adhesive such as an acrylic pressure-sensitive adhesive and a rubber based pressure-sensitive adhesive. As the pressure-sensitive adhesive, an acrylic pressure-sensitive adhesive having an acrylic polymer as a base polymer is preferable from the aspect of a cleaning and washing property of a semiconductor wafer and an electronic component such as a glass which are vulnerable to contamination by ultrapure water and an organic solvent such as alcohol.

Examples of the acrylic polymer include acrylic polymers using, as a monomer component, one or more kinds of (meth)acrylic acid alkyl esters (for example, a straight chain or branched chain alkyl ester having 1 to 30 carbon atoms, and particularly 4 to 18 carbon atoms in the alkyl group such as methylester, ethylester, propylester, isopropylester, butylester, isobutylester, sec-butylester, t-butylester, pentylester, isopentylester, hexylester, heptylester, octylester, 2-ethylhexylester, isooctylester, nonylester, decylester, isodecylester, undecylester, dodecylester, tridecylester, tetradecylester, hexadecylester, octadecylester, and eicosylester) and (meth)acrylic acid cycloalkyl esters (for example, cyclopentylester, cyclohexylester, etc.). The (meth)acrylic acid ester means an acrylic acid ester and/or a methacrylic acid ester, and has very the same meaning as (meth) in the present invention.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl (meth)acrylate, carboxypentyl (meth)acrylate, itaconic acid, maleic acid, fumaric acid, and crotonic acid; acid anhydride monomers such as maleic anhydride, and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxylmethylcyclohexyl)methyl (meth)acrylate; sulfonic acid group containing monomers such as styrenesulfonic acid, allylsulfonic acid, 2-(meth)acrylamide-2-methylpropanesulfonic acid, (meth)acrylamidepropanesulfonic acid, sulfopropyl (meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer(s) to be used is preferably 40% or less by weight of all the monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylol propane tri(meth)acrylate, pentaerythritol tri(meth)acrylate, dipentaerythritol hexa(meth)acrylate, epoxy (meth)acrylate, polyester (meth)acrylate, urethane (meth)acrylate etc. These multifunctional monomers can also be used as a mixture of one or more thereof. From the viewpoint of adhesiveness etc., the use amount of the multifunctional monomer is preferably 30 wt % or less based on the whole monomer components.

The above acryl-based polymer is obtained by polymerizing a mixture of one or two or more kinds of monomers. The polymerization can be performed by applying an appropriate manner such as a solution polymerization manner, an emulsion polymerization manner, a bulk polymerization manner, or a suspension polymerization manner. From the viewpoint of prevention of contamination of a clean adherend, or the like, the content of a low molecular weight material is preferably prevented. From this viewpoint, the acryl-based polymer preferably has a number average molecular weight of preferably 100,000 or more, more preferably 200,000 to 3,000,000, and particularly preferably 300,000 to 1,000,000.

To increase the number-average molecular weight of the base polymer such as acrylic polymer etc., an external crosslinking agent can be suitably adopted in the pressure-sensitive adhesive. The external crosslinking method is specifically a reaction method that involves adding and reacting a crosslinking agent such as a polyisocyanate compound, epoxy compound, aziridine compound, melamine crosslinking agent, urea resin, anhydrous compound, polyamine, carboxyl group-containing polymer. When the external crosslinking agent is used, the amount of the crosslinking agent to be used is determined suitably depending on balance with the base polymer to be crosslinked and applications thereof as the pressure-sensitive adhesive. In general, the crosslinking agent is compounded preferably about 5 parts by weight or less, and more preferably 0.1 to 5 parts by weight to 100 parts by weight of the base polymer. The conventionally known various additives such as a tackifier and an anti-aging agent may be used as the pressure-sensitive adhesive besides the above-described components as needed.

The pressure-sensitive adhesive layer 2 may be formed of a radiation-curable pressure-sensitive adhesive. The adhesive force of the radiation-curable pressure-sensitive adhesive can be controlled by irradiation with radiation such as ultraviolet rays. For example, when the radiation-curable pressure-sensitive adhesive is irradiated with ultraviolet rays in a state where the sheet for heat bonding 3 is laminated, an anchor effect can be generated between the radiation-curable pressure-sensitive adhesive and the sheet for heat bonding 3. Thereby, the adhesion between the pressure-sensitive adhesive layer 2 and the sheet for heat bonding 3 can be improved. By irradiating the radiation-curable pressure-sensitive adhesive with the radiation before laminating the sheet for heat bonding, the adhesive force between the pressure-sensitive adhesive layer 2 and the sheet for heat bonding 3 can be reduced.

For the radiation curing-type pressure-sensitive adhesive, one having a radiation-curable functional group such as a carbon-carbon double bond and showing adherability can be used without particular limitation. Examples of the radiation curing-type pressure-sensitive adhesive include an addition-type radiation-curable pressure-sensitive adhesive obtained by blending a radiation-curable monomer component or an oligomer component with a general pressure-sensitive adhesive such as the above-mentioned acryl-based pressure-sensitive adhesive or rubber-based pressure-sensitive adhesive.

Examples of the radiation-curable monomer component to be compounded include such as an urethane oligomer, urethane(meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, and 1,4-butane dioldi(meth)acrylate. Further, the radiation-curable oligomer component includes various types of oligomers such as an urethane based, a polyether based, a polyester based, a polycarbonate based, and a polybutadiene based oligomer, and its molecular weight is appropriately in a range of about 100 to 30,000. The compounding amount of the radiation-curable monomer component and the oligomer component can be appropriately determined to an amount in which the adhesive strength of the pressure-sensitive adhesive layer can be decreased depending on the type of the pressure-sensitive adhesive layer. Generally, it is for example 5 to 500 parts by weight, and preferably about 40 to 150 parts by weight based on 100 parts by weight of the base polymer such as an acrylic polymer constituting the pressure sensitive adhesive.

Further, besides the addition-type radiation-curable pressure-sensitive adhesive described above, the radiation curing-type pressure-sensitive adhesive includes an intrinsic-type radiation-curable pressure-sensitive adhesive using an acrylic polymer having a radical reactive carbon-carbon double bond in the polymer side chain, in the main chain, or at the end of the main chain as the base polymer. The intrinsic-type radiation-curable pressure-sensitive adhesives of an internally provided type are preferable because they do not have to contain the oligomer component, etc. that is a low molecular component, or most of them do not contain, they can form a pressure-sensitive adhesive layer having a stable layer structure without migrating the oligomer component, etc. in the pressure sensitive adhesive over time.

The above-mentioned base polymer, which has a carbon-carbon double bond, may be any polymer that has a carbon-carbon double bond and further has viscosity. As such a base polymer, a polymer having an acrylic polymer as a basic skeleton is preferable. Examples of the basic skeleton of the acrylic polymer include the acrylic polymers exemplified above.

The method for introducing a carbon-carbon double bond into any one of the above-mentioned acrylic polymers is not particularly limited, and may be selected from various methods. The introduction of the carbon-carbon double bond into a side chain of the polymer is easier in molecule design. The method is, for example, a method of copolymerizing a monomer having a functional group with an acrylic polymer, and then causing the resultant to condensation-react or addition-react with a compound having a functional group reactive with the above-mentioned functional group and a carbon-carbon double bond while keeping the radial ray curability of the carbon-carbon double bond.

Examples of the combination of these functional groups include a carboxylic acid group and an epoxy group; a carboxylic acid group and an aziridine group; and a hydroxyl group and an isocyanate group. Of these combinations, the combination of a hydroxyl group and an isocyanate group is preferable from the viewpoint of the easiness of reaction tracing. If the above-mentioned acrylic polymer, which has a carbon-carbon double bond, can be produced by the combination of these functional groups, each of the functional groups may be present on any one of the acrylic polymer and the above-mentioned compound. It is preferable for the above-mentioned preferable combination that the acrylic polymer has the hydroxyl group and the above-mentioned compound has the isocyanate group. Examples of the isocyanate compound in this case, which has a carbon-carbon double bond, include methacryloyl isocyanate, 2-methacryloyloxyethyl isocyanate, and m-isopropenyl-α,α-dimethylbenzyl isocyanate. The used acrylic polymer may be an acrylic polymer copolymerized with any one of the hydroxyl-containing monomers exemplified above, or an ether compound such as 2-hydroxyethyl vinyl ether, 4-hydroxybutyl vinyl ether or diethylene glycol monovinyl ether.

The intrinsic-type radiation-curable pressure-sensitive adhesive may be made only of the above-mentioned base polymer (in particular, the acrylic polymer), which has a carbon-carbon double bond. However, the above-mentioned radiation-curable monomer component or oligomer component may be incorporated into the base polymer to such an extent that properties of the adhesive are not deteriorated. The amount of the radiation-curable oligomer component or the like is usually 30 parts or less by weight, preferably from 0 to 10 parts by weight for 100 parts by weight of the base polymer.

In the case that the radiation-curable pressure-sensitive adhesive is cured with ultraviolet rays or the like, a photopolymerization initiator is incorporated into the adhesive. Examples of the photopolymerization initiator include α-ketol compounds such as 4-(2-hydroxyethoxy)phenyl(2-hydroxy-2-propyl)ketone, α-hydroxy-α,α'-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride compounds such as 2-naphthalenesulfonyl chloride; optically active oxime compounds such as 1-phenone-1,1-propanedione-2-(o-ethoxycarbonyl)oxime; benzophenone compounds such as benzophenone, benzoylbenzoic acid, and 3,3'-dimethyl-4-methoxybenzophenone; thioxanthone compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; acylphosphonoxides; and acylphosphonates. The amount of the photopolymerization initiator to be blended is, for example, from about 0.05 to 20 parts by weight for 100 parts by weight of the acrylic polymer or the like which constitutes the adhesive as a base polymer.

Further, examples of the radiation-curable pressure-sensitive adhesive which is used in the formation of the pressure-sensitive adhesive layer 2 include such as a rubber pressure-sensitive adhesive or an acryl pressure-sensitive adhesive which contains an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine, and an onium salt compound, which are disclosed in JP-A No. 60-196956. Examples of the above addition-polymerizable compound having two or more unsaturated bonds include such as polyvalent alcohol ester or oligoester of acryl acid or methacrylic acid and an epoxy or a urethane compound.

The radiation curing-type pressure-sensitive adhesive layer 2 can contain a compound that is colored by radiation irradiation as necessary. The compound that is colored by radiation irradiation is contained in the pressure-sensitive adhesive layer 2, so that only a portion irradiated with radiation can be colored. That is, the portion 2a corresponding to the workpiece pasting portion 3a shown in FIG. 1 can be colored. Therefore, whether the pressure-sensitive adhesive layer 2 is irradiated with radiation can be immediately confirmed by visual observation, which easily recognizes the workpiece pasting portion 3a, and easily pastes the workpiece. When a semiconductor chip is detected by a photosensor or the like, the detecting accuracy of the semiconductor chip is increased, which causes no malfunction during the pickup of the semiconductor chip. The compound that is colored by radiation irradiation is colorless or has a pale color before the radiation irradiation. However, the compound is colored by irradiation with radiation. Examples of the compound include a leuco dye. The ratio of use of this compound that is colored by radiation irradiation can be appropriately set.

The thickness of the pressure-sensitive adhesive layer 2 is not particularly limited. However, the thickness is preferably about 1 μm to about 50 μm from the viewpoint of preventing cracking on the cut surface of the chip and maintaining the fixation of the sheets for heat bonding 3 and 3'. The thickness is preferably 2 μm to 30 μm, and more preferably 5 μm to 25 μm.

The dicing tape 11 according to the present embodiment are produced, for example, by the following procedure.

First, the substrate 1 can be formed by a conventionally known film-forming method. The film-forming method includes, for example, a calendar film-forming method, a casting method in an organic solvent, an inflation extrusion method in a closed system, a T-die extrusion method, a co-extrusion method, and a dry lamination method.

Next, a pressure-sensitive adhesive composition solution is applied on the substrate 1 to form a coated film and the coated film is dried under predetermined conditions (optionally crosslinked with heating) to form the pressure-sensitive adhesive layer 2. Examples of the application method include, but are not limited to, roll coating, screen coating and gravure coating methods. Drying is conducted under the drying conditions, for example, the drying temperature within a range from 80 to 150° C. and the drying time within a range from 0.5 to 5 minutes. The pressure-sensitive adhesive layer 2 may also be formed by applying a pressure-sensitive adhesive composition on a separator to form a coated film and drying the coated film under the drying conditions. Then, the pressure-sensitive adhesive layer 2 is laminated on the substrate 1 together with the separator. Thus, the dicing tape 11 is produced.

The sheet for heat bonding having dicing tape 10 and 12 can be manufactured by an ordinary method. For example, the pressure-sensitive adhesive layer 2 of the dicing tape 11 can be pasted to the sheet for heat bonding 3 to manufacture the sheet for heat bonding having dicing tape 10.

In the sheet for heat bonding having dicing tape 10, it is preferable that the sheet for heat bonding 3 be covered with the separator. Examples thereof include a method for bonding the dicing tape 11 and the sheet for heat bonding 3 to each other, peeling off the substrate separator stacked on the sheet for heat bonding 3, and bonding a separator to the exposed surface of the sheet for heat bonding 3 of the sheet for heat bonding having dicing tape 10 after the substrate separator is peeled off. That is, it is preferable that the dicing tape 11, the sheet for heat bonding 3, and the separator be stacked in this order.

In the above-described embodiment, the sheet for heat bonding having dicing tape in which the dicing tape and the sheet for heat bonding are stacked has been described. However, the sheet for heat bonding of the present invention may be provided in a state of not being bonded to the dicing tape.

When the dicing tape is not bonded to the sheet for heat bonding, the sheet for heat bonding is preferably a sheet for heat bonding with separator on each of surfaces, in which the sheet for heat bonding is sandwiched between two separators. That is, it is preferable to form the sheet for heat bonding with separator on each of surfaces in which the first separator, the sheet for heat bonding, and the second separator are stacked in this order.

When the dicing tape is not bonded to the sheet for heat bonding, a separator may be stacked on only one surface of the sheet for heat bonding.

(Semiconductor Device Manufacturing Method)

The semiconductor device manufacturing method according to the present embodiment includes:

a step of preparing the sheet for heat bonding;

a step of laminating a dicing tape to the sheet for heat bonding to prepare a sheet for heat bonding having dicing tape;

a laminating step of laminating the sheet for heat bonding in the sheet for heat bonding having dicing tape and a back surface of a semiconductor wafer to each other;

a dicing step of dicing the semiconductor wafer together with the sheet for heat bonding to form a chip-like semiconductor chip;

a pickup step of picking up the semiconductor chip together with the sheet for heat bonding from the sheet for heat bonding having dicing tape; and a thermal bonding step of thermally bonding the semiconductor chip onto an adherend with the sheet for heat bonding interposed between the semiconductor chip and the adherend (hereinafter also referred to as a first embodiment).

A method for manufacturing a semiconductor device according to the present embodiment includes: a step of preparing the sheet for heat bonding having dicing tape; a pasting step of pasting the sheet for heat bonding of the sheet for heat bonding having dicing tape to a back face of a semiconductor wafer; a dicing step of performing dicing of the semiconductor wafer together with the sheet for heat bonding, to form a chip-shaped semiconductor chip; a pickup step of performing picking up of the semiconductor chip together with the sheet for heat bonding from the sheet for heat bonding having dicing tape; and a thermal bonding step of thermally bonding the semiconductor chip on an adherend with the sheet for heat bonding sandwiched therebetween (hereinafter, referred to as a second embodiment).

The method for manufacturing a semiconductor device according to the first embodiment and the method for manufacturing a semiconductor device according to the second embodiment are different from each other in that the method according to the second embodiment uses the sheet for heat bonding having dicing tape, by contrast, the method according to the first embodiment uses the sheet for heat bonding alone. These methods are common in the other points. If a step of pasting the sheet for heat bonding to the dicing tape after preparing the sheet for heat bonding is performed in the method for manufacturing a semiconductor device according to the first embodiment, the following steps can be performed in the same manner as in the method for manufacturing a semiconductor device according to the second embodiment. So, hereinafter, the method for manufacturing a semiconductor device according to the second embodiment will be described.

In the method for manufacturing a semiconductor device according to the present embodiment, first, sheets for heat bonding having a dicing tape 10 and 12 are prepared (preparing step).

After a separator that is optionally provided on the sheets for heat bonding 3, 3' is appropriately peeled off, the sheets for heat bonding having a dicing tape 10 and 12 are used as follows. Hereinafter, a case where the sheet for heat bonding having dicing tape 10 is used will be described as an example with reference to FIGS. 1 and 3.

First, a semiconductor wafer 4 is press-adhered on a semiconductor wafer pasting portion 3a of the sheet for heat bonding 3 in the sheet for heat bonding having dicing tape 10, and the semiconductor wafer 4 is fixed by adhering and holding (pasting step). The present step is performed while pressing with a pressing means such as a pressing roll. The pasting temperature upon mounting is not particularly limited, and preferably in a range of 23 to 90° C., for example.

The sheet for heat bonding 3 includes the pre-sintering layer 31 and the adhesive layer 33. A semiconductor wafer 4 is laminated to the adhesive layer 33, whereby the semiconductor wafer can be firmly fixed to the sheet 3 for heat bonding before sintering.

The semiconductor wafer 4 is preferably a semiconductor wafer in which an electrode pad is formed on one surface and a silver thin film is formed on the outermost surface of the other surface (hereinafter also referred to as back surface). The thickness of the silver thin film is, for example, 10 nm to 1000 nm. A titanium thin film may be further formed between the semiconductor wafer 4 and the silver thin film. The thickness of the titanium thin film is, for example, 10 nm to 1000 nm. When the silver thin film is formed, a semiconductor chip 5 and the sheet for heat bonding 3 can be thermally bonded to each other solidly in the thermal bonding step described later. When the titanium thin film is formed, the reliability of an electrode is improved. The silver thin film and the titanium thin film can be formed by vapor deposition, for example.

Next, the dicing of the semiconductor wafer 4 is performed (dicing step). Accordingly, the semiconductor wafer 4 is cut into a prescribed size and individualized, to manufacture a semiconductor chip 5. The dicing method is not particularly limited, and the method is performed according to a normal method from the circuit face side of the semiconductor wafer 4, for example. The present step can adopt a cutting method called full-cut that forms a slit in the sheet for heat bonding having dicing tape 10, or the like, for example. The dicing apparatus used in the present step is not particularly limited, and a conventionally known apparatus can be used. Since the semiconductor wafer 4 is adhered and fixed by the sheet for heat bonding having dicing tape 10, chip crack and chip fly can be prevented, and at the same time the damage of the semiconductor wafer 4 can be also prevented.

Next, pickup of the semiconductor chip 5 is performed in order to peel the semiconductor chip 5 that is adhered and fixed to the sheet for heat bonding having dicing tape 10 (pickup step). The method for picking up is not particularly limited, and various conventionally known methods can be adopted. Examples thereof include a method for pushing up the individual semiconductor chip 5 from the sheet for heat bonding having dicing tape 10 side with a needle and picking up the pushed semiconductor chip 5 with a pick-up apparatus.

As pickup conditions, a needle push-up speed is preferably set to 5 to 100 mm/second, and more preferably 5 to 10 mm/second from the viewpoint of preventing chipping.

When the pressure-sensitive adhesive layer 2 is an ultraviolet-ray curing-type layer, pickup may be performed after irradiating the pressure-sensitive adhesive layer 2 with ultraviolet rays. Accordingly, the adhesive strength of the pressure-sensitive adhesive layer 2 to the sheet for heat bonding 3 is decreased, and the peeling of the semiconductor chip 5 becomes easy. As a result, picking up becomes possible without damaging the semiconductor chip 5. The conditions such as irradiation intensity and irradiation time during irradiation with ultraviolet rays are not particularly limited, and may be appropriately set as necessary. A known light source can be used as a light source used for irradiation with ultraviolet rays. When the pressure-sensitive adhesive layer is previously irradiated with ultraviolet rays to be cured, and the cured pressure-sensitive adhesive layer and the sheet for heat bonding are laminated to each other, or when the pressure-sensitive adhesive layer is irradiated with irradiation after the pressure-sensitive adhesive layer and the sheet for heat bonding are laminated to each other, the pressure-sensitive adhesive layer may not be irradiated with ultraviolet rays here.

Next, the semiconductor chip 5 that is picked up is die-attached (thermally bonded) to an adherend 6 with the sheet for heat bonding 3 sandwiched therebetween (thermal bonding step). Examples of the adherend 6 include a lead frame, a TAB film, a substrate, and a semiconductor chip that is separately produced. The adherend 6 may be a deformation type adherend that can be easily deformed or a non-deformation type adherend that is difficult to be deformed (semiconductor wafer or the like), for example.

Examples of the lead frame include a metal lead frame such as a Cu lead frame or a 42 Alloy lead frame. As the substrate, a conventionally known substrate can be used. Examples thereof include an organic substrate made of glass epoxy, BT (bismaleimide-triazine), or polyimide. Among these, the metal lead frame can be integrated with the fine metal particles by thermal bonding. Examples of the substrate include an insulating circuit board in which a copper circuit board is laminated on an insulating substrate such as a ceramic plate. By using the insulating circuit board, a power semiconductor device for controlling and supplying electric power can be manufactured, for example.

In the thermal bonding step, the fine metal particles are sintered by heating, and the thermally-decomposable binder is thermally decomposed as necessary. The residual low-boiling binder which has not been sufficiently volatilized in the drying step is volatilized. A heating temperature is preferably 180 to 400° C., more preferably 190 to 370° C., and still more preferably 200 to 350° C. A heating time is preferably 0.3 to 300 minutes, more preferably 0.5 to 240 minutes, and still more preferably 1 to 180 minutes. Thermal bonding may be performed under a pressurized condition. The pressurized condition is preferably in a range of 1 to 500 kg/cm², and more preferably in a range of 5 to 400 kg/cm². Thermal bonding under pressure can be executed by an apparatus that can simultaneously perform heating and pressurizing such as a flip chip bonder, for example. A parallel plate press may also be used.

Figure 3:
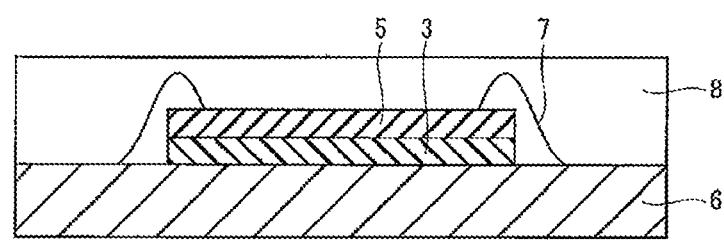
FIG. 3 is a schematic cross-sectional view for describing a manufacturing method of a semiconductor device according to the present embodiment.

Next, as necessary, as shown in FIG. 3, the tip of a terminal part (inner lead) of the adherend 6 is electrically connected with an electrode pad (not shown) on the semiconductor chip 5 with a bonding wire 7 (wire bonding step). As the bonding wire 7, for example, a gold wire, an aluminum wire, or a copper wire or the like is used. The temperature when the wire bonding is performed is from 23 to 300° C., and preferably from 23 to 250° C. The heating time is from several seconds to several minutes. The connection of the wires is performed using a combination of vibration energy based on ultrasonic waves with compression energy based on the application of pressure in a state where the wires are heated to a temperature in the above-mentioned range.

Next, as necessary, as shown in FIG. 3, the semiconductor chip 5 is sealed with a sealing resin 8 (sealing step). This step is performed for protecting the semiconductor chip 5 that is loaded on the adherend 6 and the bonding wire 7. This step can be performed by molding a resin for sealing with a mold. As the sealing resin 8, an epoxy-based resin is used, for example. The resin sealing is usually performed at a heating temperature of 175° C. for 60 to 90 seconds, but the present invention is not limited thereto. For example, curing can be performed at 165 to 185° C. for several minutes. Therefore, the sealing resin 8 is cured. In this sealing step, a method for embedding a semiconductor chip 5 in a sheet shaped sealing sheet (for example, see JP-A-2013-7028) can also be adopted. In addition to the method for molding a sealing resin with a mold, a gel sealing method for casting silicone gel into a case type container may be used.

Next, heating is performed as necessary, to completely cure the sealing resin 8 that is insufficiently cured in the sealing step (post curing step). The heating temperature in this step differs depending on the type of the sealing resin. However, the heating temperature is in a range of 165 to 185° C., for example, and the heating time is in a range of about 0.5 to about 8 hours.

The sheet for heat bonding of the present invention and the sheet for heat bonding having dicing tape can be suitably used when laminating a plurality of semiconductor chips to carry out three-dimensional mounting. At this time, a sheet for heat bonding and a spacer may be laminated between the semiconductor chips, or only a sheet for heat bonding may be laminated between semiconductor chips without laminating a spacer. The mode of mounting can be appropriately changed according to the manufacturing condition and the use, or the like.

The sheet for heat bonding of the present invention and the sheet for heat bonding having dicing tape are not limited to the uses illustrated above, and can be used for thermally bonding two objects.

Another Embodiment

A sheet for heat bonding according to the present invention may further include a component migration prevention layer formed on a surface opposite to a surface on which an adhesive layer of a pre-sintering layer is stacked. That is, the sheet for heat bonding according to the present invention may have a constitution in which an adhesive layer, a pre-sintering layer, and a component migration prevention layer are stacked in this order.

A sheet for heat bonding having dicing tape according to the present invention may include a dicing tape, wherein the sheet for heat bonding has a constitution in which an adhesive layer, a pre-sintering layer, and a component migration prevention layer are stacked in this order, and the sheet for heat bonding is stacked on the dicing tape in a state where the dicing tape and the component migration prevention layer are in contact with each other.

Figure 4:
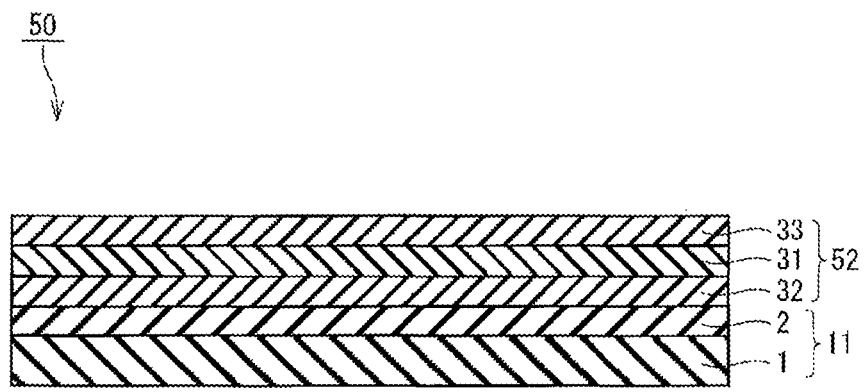
FIG. 4 is a schematic cross-sectional view showing a sheet for heat bonding having dicing tape according to another embodiment of the present invention.

FIG. 4 is a schematic cross-sectional view showing a sheet for heat bonding having dicing tape according to another embodiment of the present invention.

As shown in FIG. 4, a sheet for heat bonding 50 having dicing tape has a constitution in which a sheet for heat bonding is stacked on a dicing tape 11. The dicing tape 11 is constituted by stacking a pressure-sensitive adhesive layer 2 on a substrate 1, and the sheet for heat bonding 52 is provided on the pressure-sensitive adhesive layer 2.

The sheet for heat bonding 52 has a constitution in which an adhesive layer 33, a pre-sintering layer 31, and a component migration prevention layer 32 are stacked in this order. The sheet for heat bonding 52 is stacked on the dicing tape 11 in a state where the dicing tape 11 and the component migration prevention layer 32 are in contact with each other.

Since the pre-sintering layer 31 and the adhesive layer 33 have already been described, the descriptions thereof will be omitted here.

(Component Migration Prevention Layer)

The component migration prevention layer 32 is a layer for suppressing the components of the pre-sintering layer 31 from migrating to the dicing tape 11 and the components of the dicing tape 11 from migrating to the pre-sintering layer 31.

The component migration prevention layer 32 contains a large amount of components decomposed by heating, whereby the component migration prevention layer 32 is almost decomposed and lost when the pre-sintering layer 31 is heated to form the sintered layer.

The component migration prevention layer 32 preferably contains at least an organic binder. When the component migration prevention layer 32 contains the organic binder, the component migration prevention layer 32 is easily treated as a sheet. Even if the pre-sintering layer 31 contains the organic binder, the component migration prevention layer 32 is present, whereby it is possible to suppress the components of the pre-sintering layer 31 from migrating to the dicing tape 11, and the components of the dicing tape 11 from migrating to the pre-sintering layer 31.

The organic binder contained in the component migration prevention layer 32 preferably contains a thermally decomposable binder. Low molecular weight components tend to be less likely to pass through the thermally decomposable binder. Therefore, when the organic binder contained in the component migration prevention layer 32 contains the thermally decomposable binder, it is possible to suitably suppress the components of the pre-sintering layer 31 from migrating to the dicing tape 11, and the components of the dicing tape 11 from migrating to the pre-sintering layer 31.

As the thermally decomposable binder, the same binder as that used in the pre-sintering layer 31 can be adopted.

The content of the thermally decomposable binder is preferably 80 to 100% by weight, and more preferably 90 to 100% by weight based on the entire component migration prevention layer 32. When the content of the thermally decomposable binder is 80 to 100% by weight based on the entire component migration prevention layer 32, it is possible to suitably suppress the components from migrating between the pre-sintering layer 31 and the dicing tape 11.

The organic binder contained in the component migration prevention layer 32 preferably contains 0 to 20% by weight of an organic component having a molecular weight of 500 or less based on the entire organic binder of the component migration prevention layer. That is, it is preferable that the component migration prevention layer 32 contains no organic component having a molecular weight of 500 or less, or contains 10% by weight or less of the organic component. The content of the organic component having a molecular weight of 500 or less is more preferably 0 to 15% by weight, and still more preferably 0 to 10% by weight.

The organic component having a molecular weight of 500 or less is a component which is apt to migrate to the other sheet (the dicing tape 11 in the present embodiment) because of its small molecular weight. Therefore, it can be said that, when the organic binder contained in the component migration prevention layer 32 contains 0 to 20% by weight of an organic component having a molecular weight of 500 or less, few components are apt to migrate. Therefore, it is possible to suppress the components from migrating from the component migration prevention layer 32 to the pre-sintering layer 31 and the dicing tape 11.

The organic component having a molecular weight of 500 or less contains a low boiling point binder and an organic component having a molecular weight of 500 or less other than the low boiling point binder. As the low boiling point binder, the same binder as that used in the pre-sintering layer 31 can be adopted.

The content of the organic component having a molecular weight of 500 or less and contained in the component migration prevention layer 32 can be measured by the same method as the method for measuring the content of the organic component having a molecular weight of 500 or less and contained in the pre-sintering layer 31.

It is preferable that the component migration prevention layer 32 contains no metal fine particles, or contains 30% by volume or less of the metal fine particles based on the entire component migration prevention layer. That is, the content of the metal fine particles contained in the component migration prevention layer 32 is preferably in the range of 0 to 30% by volume based on the entire component migration prevention layer. When the content of the metal fine particles contained in the component migration prevention layer 32 is within the range of 0 to 30% by volume based on the entire component migration prevention layer, a path in which the components of the pre-sintering layer 31 migrate to the dicing tape 11 can be reduced. As a result, the migration of the components can be further suppressed.

As the metal fine particles, the same metal fine particles as those used in the pre-sintering layer 31 can be adopted. The content of the metal fine particles contained in the component migration prevention layer 32 is measured by the same method as the method for measuring the content of the metal fine particles contained in the pre-sintering layer 31.

The thickness of the component migration prevention layer 32 is preferably in the range of 2 to 10 μm, more preferably in the range of 2.5 to 8 μm, and still more preferably in the range of 3 to 6 μm. The component migration prevention layer 32 contains no metal fine particles, or contains the metal fine particles in an amount less than that in the pre-sintering layer. Therefore, a too thick component migration prevention layer hinders bonding provided by sintering. Therefore, when the thickness of the component migration prevention layer 32 is in the range of 2 to 10 μm, a large influence on bonding provided by sintering can be prevented.

In particular, it is preferable that, when the thickness of the component migration prevention layer 32 is decreased within the above numerical range, the component migration prevention layer 32 contains no metal fine particles, or contain the metal fine particles in a less amount within the above numerical range. This is because the path of low molecular weight components can be reduced.

Meanwhile, when the thickness of the component migration prevention layer 32 is increased within the above numerical range, the content of the metal fine particles is preferably increased within the above numerical range. When the thickness of the component migration prevention layer 32 is increased, the bonding force of a portion where the component migration prevention layer 32 is present after sintering may be decreased. Therefore, the metal fine particles are contained to some extent, which make it possible to provide the bonding force after sintering. If the thickness of the component migration prevention layer 32 is increased, the adhesive force before sintering is easily controlled. The thickness of the component migration prevention layer 32 is measured in the same manner as the method for measuring the thickness of the pre-sintering layer 31.

As described above, the sheet for heat bonding 52 includes the adhesive layer 33, whereby the sheet for heat bonding 52 can have high adhesion before sintering with respect to the object to be bonded, and provide strengthened bonding after sintering. Furthermore, the sheet for heat bonding 52 includes the component migration prevention layer 32, whereby it is possible to prevent the components of the pre-sintering layer 31 from migrating to the dicing tape 11 and the components of the dicing tape 11 from migrating to the pre-sintering layer 31 before the sheet for heat bonding 52 is provided for use.

EXAMPLES

Hereinafter, the present invention will be described in detail by way of examples. However, the present invention is not limited to the examples below as long as the present invention does not exceed the gist thereof.

Components used in Examples will be described.

Thermally decomposable binder A (polypropylene carbonate resin): QPAC 40 manufactured by Empower Corporation, solid at 23° C.

Low boiling point binder A (isobornyl cyclohexanol): Telsolube MTPH manufactured by Nippon Terpene Chemical Co., Ltd., liquid at 23° C.

Metal fine particles A: copper fine particles having an average particle size of 200 nm and manufactured by Mitsui Mining & Smelting Co., Ltd.

Organic solvent A: Methyl ethyl ketone (MEK)

Example 1

<Preparation of Pre-Sintering Layer>

A solution (12 wt %) prepared by previously dissolving a thermally decomposable binder A in MEK at a weight ratio of 1:1, a low boiling point binder A (4 wt %), metal fine particles A (60 wt %), and an organic solvent A (24% by weight) were placed in a stirring pot of a hybrid mixer (HM-500, manufactured by Keyence Corporation), and stirred and mixed in a stirring mode for 3 minutes.

The varnish thus obtained was applied to a release-treated film (MRA 38 manufactured by Mitsubishi Plastics Co., Ltd.) so as to have a thickness after drying of 70 μm, and dried to obtain a pre-sintering layer A. The drying was performed at 80° C. for 2 minutes.

<Production of Adhesive Layer>

A solution (40% by weight) prepared by previously dissolving a thermally decomposable binder A in MEK at a weight ratio of 1:1, a low boiling point binder A (13% by weight), metal fine particles A (30% by weight), and an organic solvent A (17% by weight) were placed in a stirring pot of a hybrid mixer (HM-500, manufactured by Keyence Corporation), and stirred and mixed in a stirring mode for 3 minutes.

The varnish thus obtained was applied to a release-treated film (MRA 38 manufactured by Mitsubishi Plastics Co., Ltd.) so as to have a thickness after drying of 10 μm, and dried to obtain an adhesive Layer A. The drying was carried out at 80° C. for 2 minutes.

<Preparation of Sheet for Heat Bonding>

The coating dried surfaces of the pre-sintering layer A and adhesive layer A were made to face each other, and laminated to each other at 70° C. with a hydraulic laminator to obtain a sheet for heat bonding A.

[Evaluation of Adhesive]
<Preparation of Dicing Tape>

100 parts of 2-ethylhexyl acrylate, 19 parts of 2-hydroxyethyl acrylate, 0.4 parts of benzoyl peroxide, and 80 parts of toluene were placed in a reaction vessel equipped with a condenser, a nitrogen inlet tube, a thermometer, and a stirring device, and polymerized at 60° C. for 10 hours in a nitrogen stream to obtain an acrylic polymer A.

1.2 parts of 2-methacryloyloxyethyl isocyanate was added to the acrylic polymer A to obtain a mixture, and the mixture was subjected to an addition reaction treatment at 50° C. for 60 hours in an air stream to obtain an acrylic polymer A'.

Next, 1.3 parts of a polyisocyanate compound (trade name "Coronate L", manufactured by Nippon Polyurethane Industry Co., Ltd.) and 3 parts of a photopolymerization initiator (trade name "Irgacure 184", manufactured by Ciba Specialty Chemicals Co., Ltd.) were added to 100 parts of the acrylic polymer A' to prepare a pressure-sensitive adhesive solution (also referred to as "pressure-sensitive adhesive solution A").

The pressure-sensitive adhesive solution A prepared above was applied on the silicone-treated surface of a PET release liner, and dried by heating at 120° C. for 2 minutes to form a pressure-sensitive adhesive layer A having a thickness of 10 μm. Subsequently, an EVA film (ethylene-vinyl acetate copolymer film) having a thickness of 125 μm and manufactured by Gunze Limited was laminated to the exposed surface of the pressure-sensitive adhesive layer A to prepare a laminated product, and the laminated product was stored at 23° C. for 72 hours to obtain a dicing tape A.

<Evaluations>

A silicon wafer (silicon wafer thickness: 200 μm) was prepared, in which a Ti layer (thickness: 50 nm) and an Ag layer (thickness: 100 nm) were formed in this order on a back surface.

The sheets for heat bonding of Examples were laminated to the respective prepared dicing tapes A at room temperature (23° C.). The laminating was carried out in a state where the dicing tape and the pre-sintering layer were in contact with each other. Next, ultraviolet irradiation was carried out with UV irradiation (condition: ultraviolet (UV) irradiation device (trade name "UM-810" (manufactured by Nitto Seiki Co., Ltd.) with a cumulative light amount of ultraviolet radiation: 300 mJ/cm$^2$). Next, the prepared silicon wafer was laminated to the adhesive layer of the sheet for heat bonding with the Ag layer as a laminating surface. The laminating was carried out using a laminating device: trade name "MA-3000 II" manufactured by Nitto Seiki Co., Ltd., at a laminating speed meter: 10 mm/min, a laminating pressure: 0.2 MPa, and a stage temperature during laminating: 60° C. As a result, a structure was obtained, in which the silicon wafer, the adhesive layer, the pre-sintering layer, and the dicing tape were stacked in this order.

Next, dicing was carried out with Dicer (DFD 6361) manufactured by DISCO Corporation under the following dicing conditions.

<Dicing Condition>

Dicing ring: "2-8-1" (manufactured by DISCO Corporation)

Dicing speed: 30 mm/sec
Dicing blade:
Z1: "NBC-ZH203O-SE27HCDD" manufactured by DISCO Corporation
Z2: "NBC-ZH203O-SE27HCBB" manufactured by DISCO Corporation Dicing blade rotation speed:
Z1; 45,000 rpm
Z2; 45,000 rpm
Z1 Blade height: half the height of the wafer
Z2 Blade height: center of the pressure-sensitive adhesive layer of the dicing tape
Cut method: step cutting
Wafer chip size: 5.0 mm square When the individualized wafers were peeled off during dicing, the wafers were considered to have low adhesion, and determined as "poor". When the individualized wafers were not peeled off during dicing, the wafers were considered to have high adhesion, and determined as "good". The results are shown in Table 1.

TABLE 1

|  |  | Example 1 |
| --- | --- | --- |
| Thickness (μm) | Pre-sintering layer | 70 |
|  | Adhesive layer | 10 |
| Content of metal fine particles | Pre-sintering layer | 44 |
| (% by Volume) | Adhesive layer | 10 |
| Evaluation of adhesion |  | good |

Example 2

<Preparation of Pre-Sintering Layer>
For the pre-sintering layer, the same pre-sintering layer A as that in Example 1 was used.

<Production of Adhesive Layer>
For the adhesive layer, the same adhesive layer A as that in Example 1 was used.

<Production of Component Migration Prevention Layer>
A solution (50% by weight) obtained by previously dissolving a thermally decomposable binder A in MEK at a weight ratio of 1:1 and an organic solvent A (50% by weight) were placed in a stirring pot of a hybrid mixer (HM-500 manufactured by Keyence Corporation), and stirred and mixed in a stirring mode for 3 minutes.

The obtained varnish was applied to a release-treated film (MRA 38 manufactured by Mitsubishi Plastics Co., Ltd.) so as to have a thickness after drying of 6 μm, and dried to obtain a component migration prevention layer A. The drying was carried out at 80° C. for 2 minutes.

<Preparation of Sheet for Heat Bonding>
First, the coating dried surfaces of the pre-sintering layer A and component migration prevention layer A were made to face each other, and laminated to each other at 70° C. with a hydraulic laminator. Then, the surface of the pre-sintering layer A on which the component migration prevention layer A was not stacked and the coating dried surface of the adhesive layer A were made to face each other, and laminated to each other at 70° C. with a hydraulic laminator to obtain a sheet for heat bonding B for a pre-sintering layer.

[Evaluation of Adhesion]
The sheet for heat bonding of Example 2 was laminated to the dicing tape A prepared above at room temperature (23° C.). The laminating was carried out in a state where the dicing tape and the component migration prevention layer were in contact with each other. Next, ultraviolet irradiation was carried out with UV irradiation (condition: ultraviolet (UV) irradiation device (trade name "UM-810" (manufactured by Nitto Seiki Co., Ltd.) with a cumulative light amount of ultraviolet radiation: 300 mJ/cm$^2$). Next, the prepared silicon wafer was laminated to the adhesive layer of the sheet for heat bonding with the Ag layer as a laminating surface. The laminating was carried out using a laminating device: trade name "MA-3000 II" manufactured by Nitto Seiki Co., Ltd., at a laminating speed meter: 10 ram/min, a laminating pressure: 0.2 MPa, and a stage temperature during laminating: 60° C. As a result, a structure was obtained, in which the silicon wafer, the adhesive layer, the pre-sintering layer, the component migration prevention layer, and the dicing tape were stacked in this order. Thereafter, the adhesion was evaluated in the same manner as in Example 1. The results are shown in Table 2.

[Evaluation of Component Migration Suppression]

The sheet for heat bonding of Example 2 was laminated to the prepared dicing tapes A at room temperature (23° C.). The laminating was carried out in a state where the dicing tape and the component migration prevention layer were in contact with each other. Next, ultraviolet irradiation was carried out with UV irradiation (condition: ultraviolet (UV) irradiation device (trade name "UM-810" (manufactured by Nitto Seiki Co., Ltd.) with a cumulative light amount of ultraviolet radiation: 300 mJ/cm$^2$). Furthermore, a heat treatment was performed at 70° C. for 10 minutes. Next, the dicing tape A was peeled off. The UV irradiation and the heat treatment here are used for a so-called acceleration test, which are different from those in the actual use condition.

About 10 mg of the sheet for heat bonding (the sheet having a three-layer structure of the adhesive layer A, the pre-sintering layer A and the component migration prevention layer A) after the dicing tape A was peeled off was cut to obtain a sample, and the sample was subjected to thermogravimetric analysis from 23° C. to 500° C. under a nitrogen atmosphere at a heating rate of 90° C./min. For the measurement, a TG-DTA simultaneous measuring apparatus (differential thermal-thermogravimetric simultaneous measuring apparatus), more specifically, a differential type differential thermal balance TG-DTA TG 8120 manufactured by Rigaku Denki Kabushiki Kaisha was used. A weight decrease amount at 23° C. was taken as 0%. When a weight in the analysis is less than a weight at 23° C., the value of the weight is a negative value. A value at 500° C. (weight loss amount (%)) was taken as Y.

The sheet for heat bonding of Example 2 (the sheets having a three-layer structure of the adhesive layer A, the pre-sintering layer A and the component migration prevention layer A) were subjected to thermogravimetric analysis as it was without being attached to the dicing tape. The method of thermogravimetric analysis was the same as above. A value at 500° C. (weight loss amount (%)) was taken as Y0.

When the absolute value of [[(Y−Y0)/Y0]×100] was more than 5, component migration was considered to sufficiently occur, and was determined as "poor". When the absolute value of [[(Y−Y0)/Y0]×100] was in the range of 0 to 5, the component migration was considered to be suppressed, and was determined as "good". The results are shown in Table 2.

TABLE 2

|  |  | Example 2 |
|---|---|---|
| Thickness (μm) | Adhesive layer | 10 |
|  | Pre-sintering layer | 70 |
|  | Component migration prevention layer | 6 |
| Content of metal fine particles (% by volume) | Adhesive layer | 10 |
|  | Pre-sintering layer | 44 |
|  | Component migration prevention layer | 0 |

TABLE 2-continued

|  |  | Example 2 |
|---|---|---|
| Content of organic component having molecular weight of 500 or less based on entire organic binder (% by weight) | Adhesive layer | 40 |
|  | Pre-sintering layer | 40 |
|  | Component migration prevention layer | 0 |
| Evaluation of adhesion |  | good |
| [(Y − Y0)/Y0] × 100 |  | −0.5 |
| Evaluation of component migration suppression |  | good |

DESCRIPTION OF REFERENCE CHARACTERS

1: Substrate
2: Pressure-sensitive adhesive layer
3, 3', 52: Sheet for heat bonding
4: Semiconductor wafer
5: Semiconductor chip
6: Adherend
7: Bonding wire
8: Sealing resin
10, 12, 50: Sheet for heat bonding having dicing tape
11: Dicing tape
31: Pre-sintering layer
32: Component migration prevention layer
33: Adhesive layer

The invention claimed is:

1. A sheet for heat bonding in semiconductor manufacturing, the sheet comprising:
   a pre-sintering layer; and
   an adhesive layer containing at least an organic binder and metal fine particles, wherein
   the pre-sintering layer and the adhesive layer are directly in contact with each other;
   the pre-sintering layer contains an organic binder;
   the organic binder contained in the pre-sintering layer contains a thermally decomposable binder;
   the thermally decomposable binder contained in the pre-sintering layer comprises at least one of polycarbonate, acrylic resin, ethyl cellulose, or polyvinyl alcohol;
   the organic binder contained in the adhesive layer contains polycarbonate; and
   a content of the metal fine particles contained in the adhesive layer is 10% or more and 30% or less by volume based on the entire adhesive layer.

2. The sheet for heat bonding according to claim 1, wherein
   a content of metal fine particles contained in the pre-sintering layer is within a range of 30 to 70% by volume based on the entire pre-sintering layer.

3. The sheet for heat bonding according to claim 1, wherein
   a thickness of the pre-sintering layer is within a range of 5 to 100 μm, and
   a thickness of the adhesive layer is within a range of 2 to 20 μm.

4. A sheet for heat bonding having dicing tape, comprising:
   a dicing tape; and
   the sheet for heat bonding according to claim 1,
   wherein the sheet for heat bonding is laminated on the dicing tape in a state where the dicing tape and the adhesive layer are in contact with each other.

* * * * *